United States Patent
Wang et al.

(10) Patent No.: US 6,410,949 B2
(45) Date of Patent: Jun. 25, 2002

(54) FLASH MEMORY DEVICE WITH MONITOR STRUCTURE FOR MONITORING SECOND GATE OVER-ETCH

(75) Inventors: John JianShi Wang, San Jose; Kent Kuohua Chang; Hao Fang, both of Cupertino, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/774,327

(22) Filed: Jan. 31, 2001

Related U.S. Application Data

(62) Division of application No. 09/368,247, filed on Aug. 3, 1999, now Pat. No. 6,323,047.

(51) Int. Cl.$^7$ .......................................... H01L 21/8242
(52) U.S. Cl. ........................ 257/252; 257/315; 257/316
(58) Field of Search ................................. 257/315, 316, 257/317, 318, 319, 320, 252

(56) References Cited

U.S. PATENT DOCUMENTS 6,056,114 A * 5/2000 Mulle-Lierheim ......... 206/50.1

* cited by examiner

*Primary Examiner*—David Nelms
*Assistant Examiner*—Dung A Le
(74) *Attorney, Agent, or Firm*—Sawyer Law Group LLP

(57) ABSTRACT

The present invention provides a method for monitoring for a second gate over etch in a flash memory device. The method includes providing at least one select transistor stack structure in the core area of the substrate and at least one monitor structure in the monitor area of the substrate; determining a thickness of a select gate layer of the at least one monitor structure; and determining if a second gate over etch occurred upon the thickness of the select gate layer of the at least one monitor structure. The select gate layer of the monitor structure is the same select gate layer of the select transistor stack structure. The select gate thickness of the select transistor stack structure may be determined by measuring the thickness at the monitor structure. This measurement is possible at the monitor area because the monitor structures are placed far enough apart to support measuring instruments. With the method in accordance with the present invention, a second gate over etch and its extent can be monitored without destroying the device. The method requires less time than conventional monitoring methods and is also less costly.

1 Claim, 7 Drawing Sheets

FLASH MEMORY DEVICE WITH MONITOR STRUCTURE FOR MONITORING SECOND GATE OVER-ETCH

CROSS-REFERENCE TO RELATED APPLICATIONS

The present application is a divisional of U.S. Ser. No. 09/368,247, filed Aug. 3, 1999, and assigned of record to Advanced Micro Devices, Inc., of Sunnyvale, Calif. now U.S. Pat. No. 6,323,047.

FIELD OF THE INVENTION

The present invention relates to semiconductor devices, and more particularly to the etching of a second gate in the semiconductor device.

BACKGROUND OF THE INVENTION

Semiconductor devices includes NAND-type flash memory devices. FIGS. 1A and 1B illustrate cross-sections of select transistors along a bit line in a portion of the core area of a conventional flash memory device. The select transistors include stack structures 100 and 150. The stack structures include a layer of select oxide 104 on a substrate 102 and a select gate 106 on the select oxide 104. The control gate comprises a polysilicon layer 110 and a tungsten silicide layer 112 on the polysilicon layer 110. A dielectric layer 108 insulates the select gate 106 from the control gate 110 and 112. The control gate 110 and 112 is coupled to a word line. A cap layer 114 composed of silicon oxynitride resides on the control gate 110 and 112 and provides an anti-reflective coating at masking.

To form the stack structures of the cells 100, 150, a mask and etch of the cap layers 114 and the control gates 110, 112 are performed. This etch is commonly referred to as a "second gate etch". Spacers 118 are then formed on the sides of the stack structures. The gaps between the cells 100, 150 are filled by an oxide 120. To form a wordline, the select gate 106 is connected to the control gates 110, 112 via a connector 116. The connector 116 is formed by first etching a contact hole in the oxide 120. The contact hole etch removes the thin dielectric layer 108 at the bottom of the hole, exposing the select gate 106. The hole is then filled with a conductive material.

Ideally, the second gate etch removes only the cap layers 114 and control gates 112, 110. However, occasionally a second gate over etch occurs. As illustrated in FIG. 1B, the second gate over etch results in the etching of the dielectric layer 108 and possibly portions of the select gate 106'. Such an over etch causes further portions of the select gate layer 106' to be etched during the contact hole etch. The resulting select gate 106' then becomes thinner than intended. Once the contact 116' is formed, with a thinner select gate 106', the wordline resistance is higher than intended. A higher wordline resistance slows down the device and compromises its reliability. The second over etch may also result in a complete punching through of the select gate 106', such that the contact 116' contacts the select oxide 104 rather than the select gate 106'. In this situation, the device becomes non-functioning.

Ways to monitor the second gate etch include measuring the thickness or the sheet resistance of the select gate 106' after the etch, however, these ways are difficult due to the small size of the device. The area between the stack structures 100 and 150 is too small to allow a measuring instrument to measure the select gate 106' thickness or sheet resistance. Another way of monitoring the second gate etch is to sample the device and observe its structure with a scanning electron microscope (SEM). However, this method requires the destruction of the device and is time-consuming. It is also an expensive process.

Accordingly, there exists a need for a method for monitoring for a second gate over etch in a flash memory device. The method should provide for monitoring without destroying the device. It should also save time and reduce costs. The present invention addresses such a need.

SUMMARY OF THE INVENTION

The present invention provides a method for monitoring for a second gate over etch in a flash memory device. The method includes providing at least one select transistor stack structure in the core area of the substrate and at least one monitor structure in the monitor area of the substrate; determining a thickness of a select gate layer of the at least one monitor structure; and determining if a second gate over etch occurred upon the thickness of the select gate layer of the at least one monitor structure. The select gate layer of the monitor structure is the same select gate layer of the select transistor stack structure. The select gate thickness of the select transistor stack structure may be determined by measuring the thickness at the monitor structure. This measurement is possible at the monitor area because the monitor structures are placed far enough apart to support measuring instruments. With the method in accordance with the present invention, a second gate over etch and its extent can be monitored without destroying the device. The method requires less time than conventional monitoring methods and is also less costly.

DETAILED DESCRIPTION

The present invention provides a method for monitoring for a second gate over etch in a flash memory device. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

The method in accordance with the present invention provides for the monitoring of a second gate over etch by providing a separate monitoring structure on the substrate. To more particularly describe the features of the present invention, please refer to FIGS. 2 through 4C in conjunction with the discussion below.

Figure 1A:
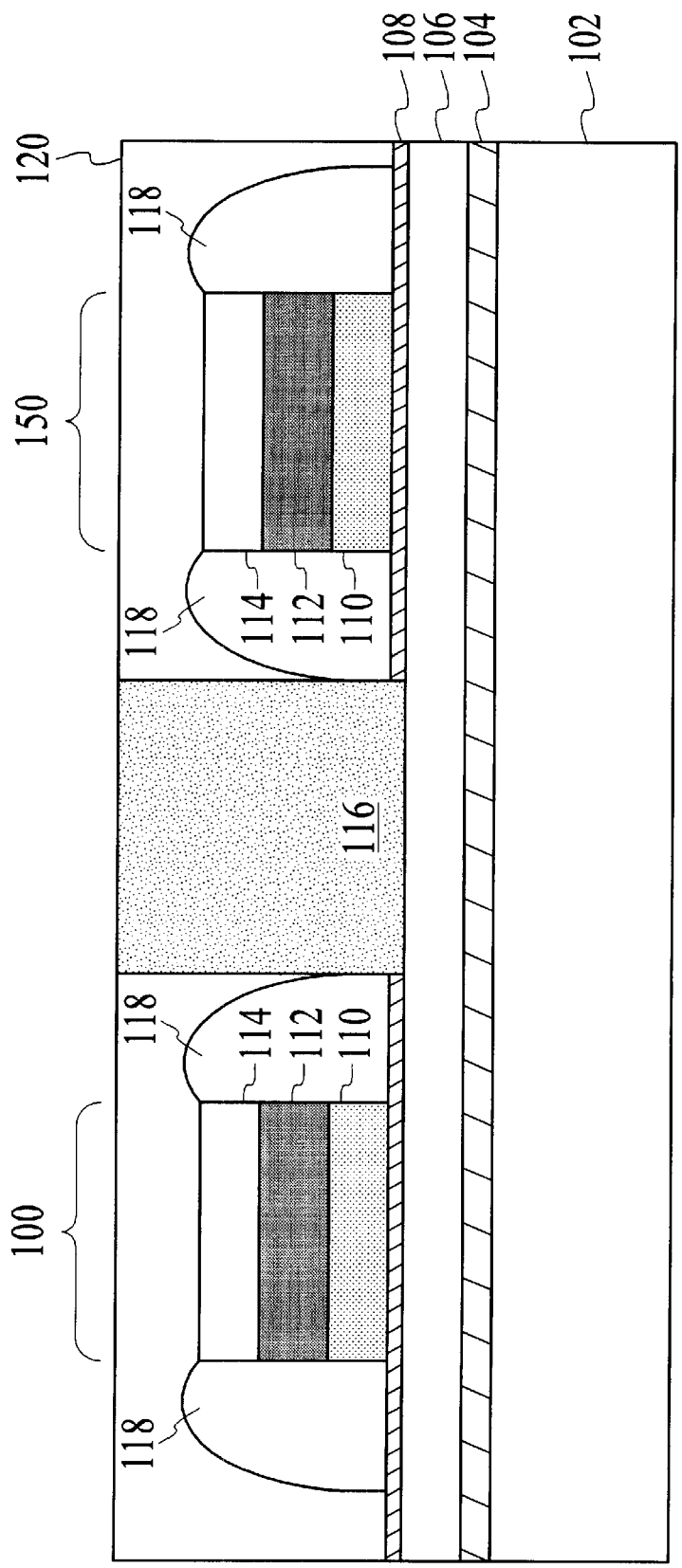
FIGS. 1A–1B illustrate cross-sections of select transistors along a bit line in a portion of the core area of a conventional flash memory device.
Figure 1B:
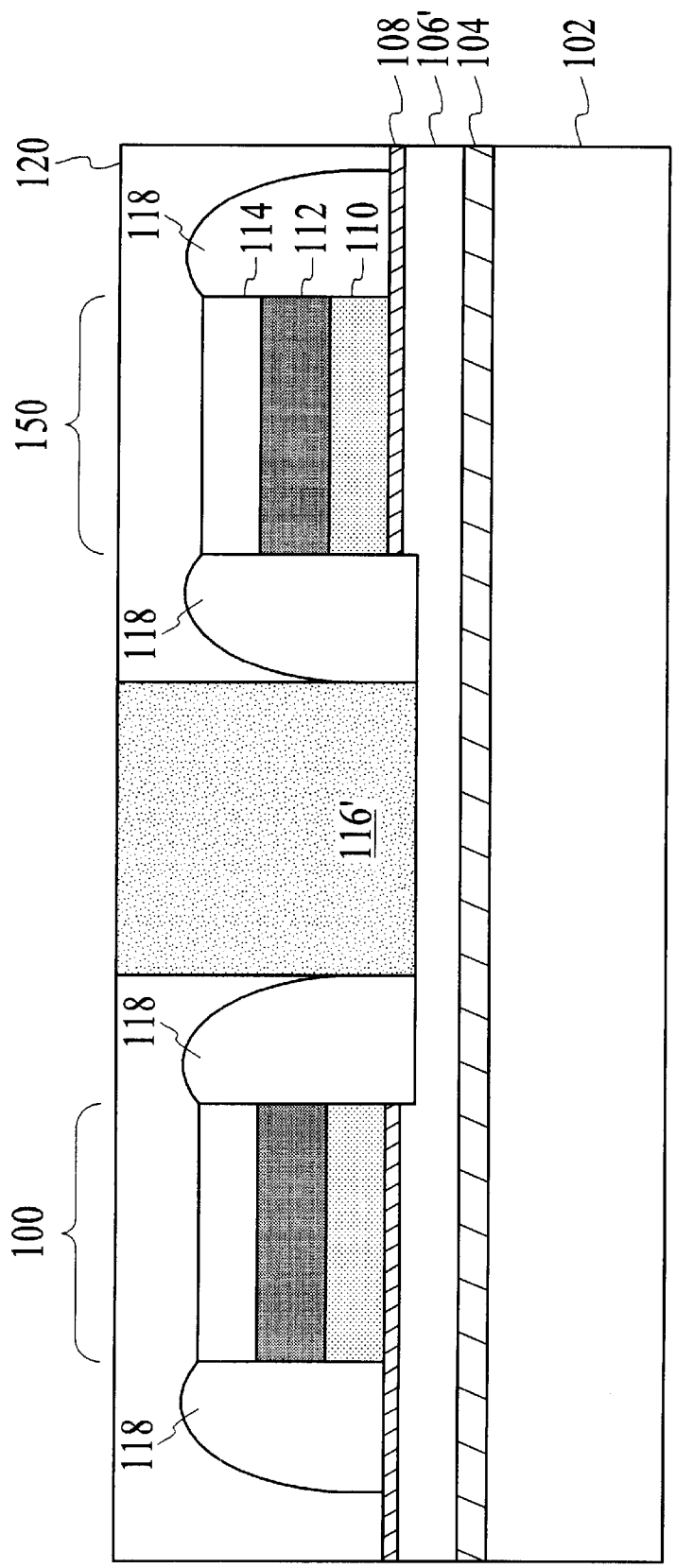
Figure 2:
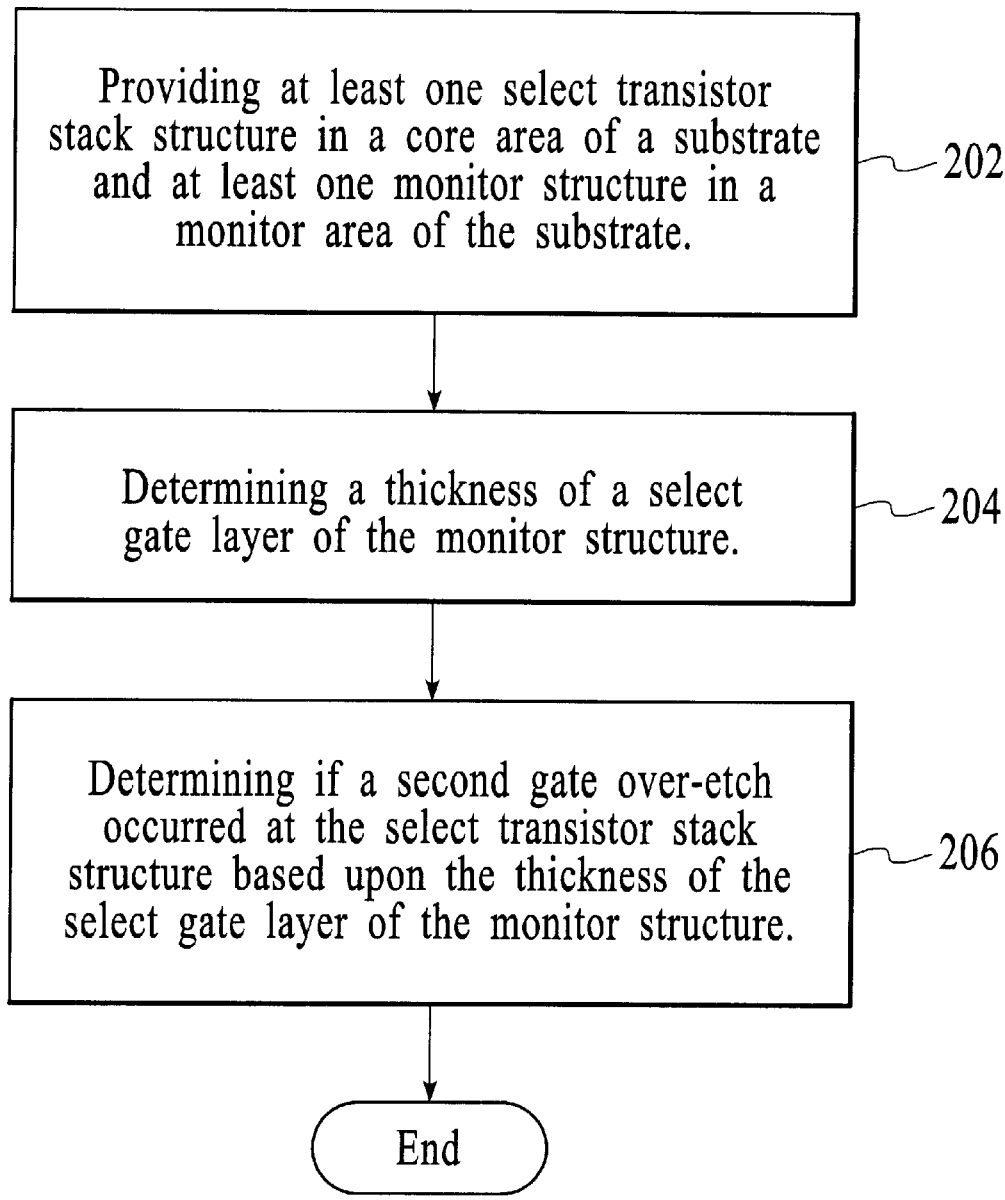
FIG. 2 is a flow chart illustrating a preferred embodiment of a method for monitoring for a second gate over etch in a flash memory device in accordance with the present invention.

FIG. 2 is a flow chart illustrating a preferred embodiment of a method for monitoring for a second gate over etch in a flash memory device in accordance with the present invention. First, at least one select transistor stack structure is provided in a core area of a substrate, and at least one monitor structure is provided in a monitor area of the substrate, via step 202. The monitor area may be any location of the substrate which is convenient to place a monitor structure. In the preferred embodiment, the monitor structures and the select transistor stack structures are formed simultaneously and in the same manner. Thus the select gate layer of the monitor structure is the same select gate layer of the select transistor stack structure. However, the monitor structures may be larger in width than the select transistor stack structures. Next, a thickness of a select gate layer of the monitor structure is determined, via step 204. In the preferred embodiment, the monitor structures are placed far enough apart such that its select gate layer may be measured. Based upon the thickness of the select gate layer of the monitor structure, a determination may be made whether a second gate over-etch occurred, via step 206.

Figure 3:
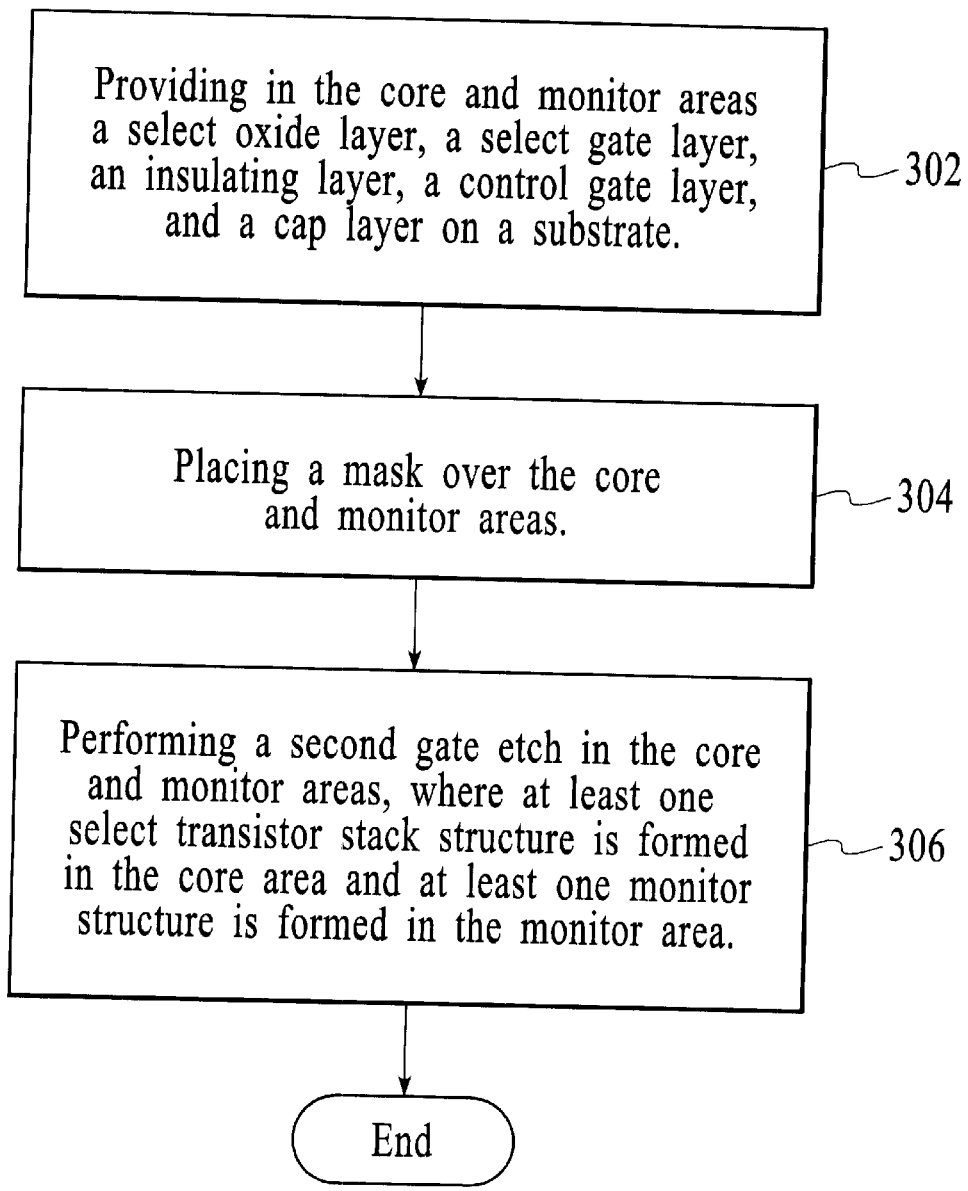
FIG. 3 is a flow chart illustrating in more detail the providing step of the method for monitoring for a second gate over etch in a flash memory device in accordance with the present invention.

FIG. 3 is a flow chart illustrating in more detail the providing step 202 of the method for monitoring for a second gate over etch in a flash memory device in accordance with the present invention. First, in the core and monitor areas, a select oxide layer, a select gate layer, an insulating layer, a control gate layer, and a cap layer are provided on the substrate, via step 302. Next, a mask is placed over the core and monitor areas, via step 304. Then, a second gate etch is performed in the core and monitor areas, where at least one select transistor stack structure is formed in the core area and at least one monitor structure is formed in the monitor area, via step 306.

In the preferred embodiment, since the select gate layer of the monitor structure is the same select gate layer of the select transistor stack structure, thus the select gate thickness of the select transistor stack structure may be determined by measuring the thickness of the select gate layer of the monitor structure. This measurement is possible at the monitor area, although not possible in the core area, because the monitor structures are placed far enough apart to support such measuring instruments. Such a spacing would not be practical in the core area due to the size constraints of the device.

One way to measure the thickness of the select gate layer of the monitor structure is a direct measurement. Since the monitor structures are placed far enough apart, a thickness measuring instrument may be used. Another way is to measure the sheet resistance of the select gate layer of the monitor structure. The resistance values of various select gate thicknesses may be predetermined using experimentation. Based on these values, a thickness of the select gate layer of the monitor structure may be determined based on its measured resistance. Other ways may be used to measure the thickness.

If the thickness of the select gate of the monitor structure, and thus the select gate of the select transistor stack structure, is thinner than intended, then a second gate over etch has occurred. If the over etch is such that the select gate thickness is less than a desired thickness, then the device is deemed unreliable. If the select gate thickness is not less than the desired thickness, then the device is reliable. With the method in accordance with the present invention, a second gate over etch and its extent can be monitored without destroying the device. The method requires less time than conventional monitoring methods and is also less costly.

Although the present invention is described with monitor structures which have the same as the select transistor stack structures, one of ordinary skill in the art will understand that simpler monitor structures which mimic the second gate etch process in the core area may be used without departing from the spirit and scope of the present invention.

Although the present invention is described with the second gate etch being performed in both the core and monitor areas, one of ordinary skill in the art will understand that the second gate etch may be performed in the monitor area only for the purpose of testing the second gate etch process without departing from the spirit and scope of the present invention.

Figure 4A:
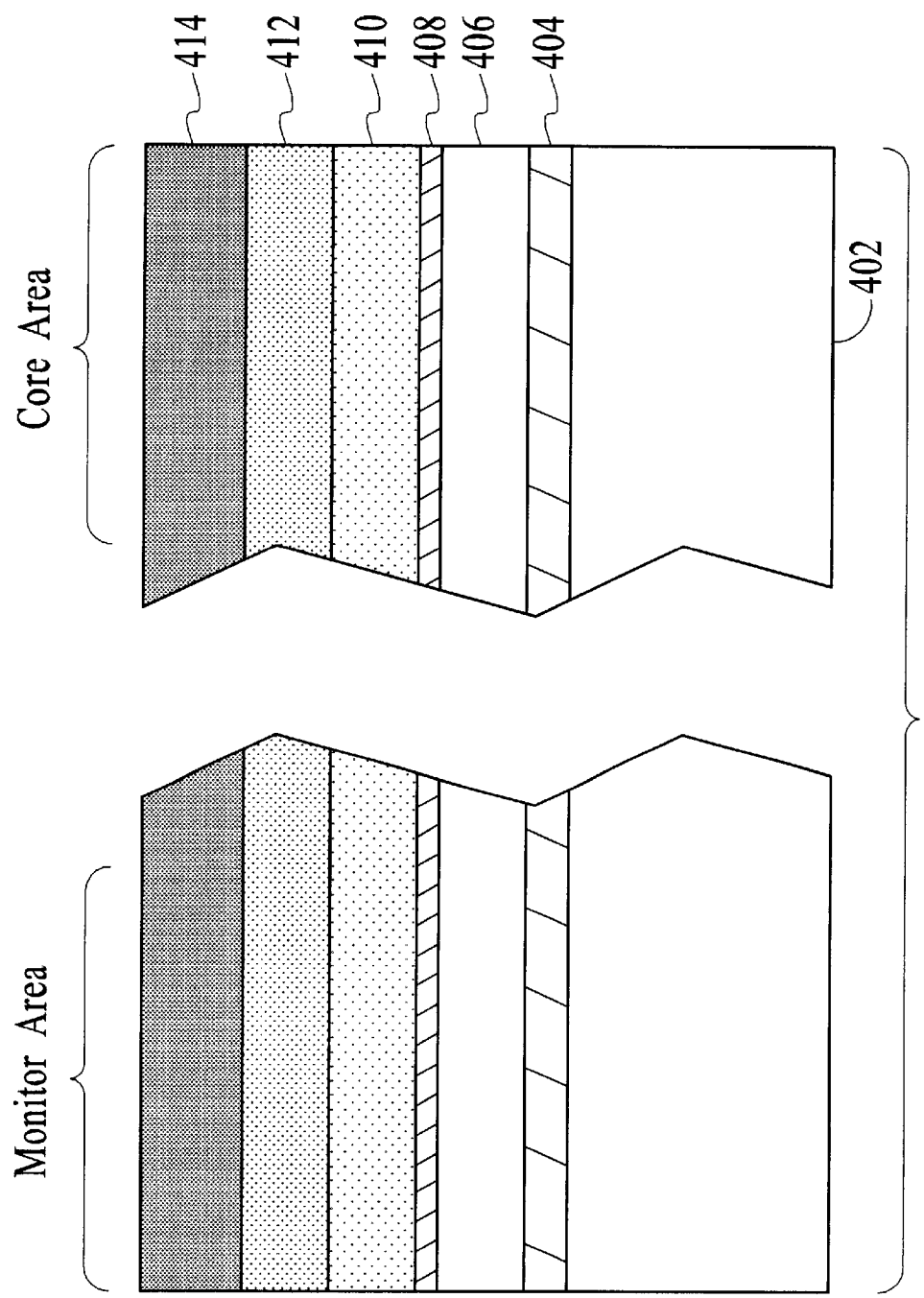
FIGS. 4A through 4C illustrate a cross-section of a portion of a flash memory device along a bit line in demonstration of the preferred embodiment of the method for providing for monitoring of a second gate over etch in accordance with the present invention.
Figure 4B:
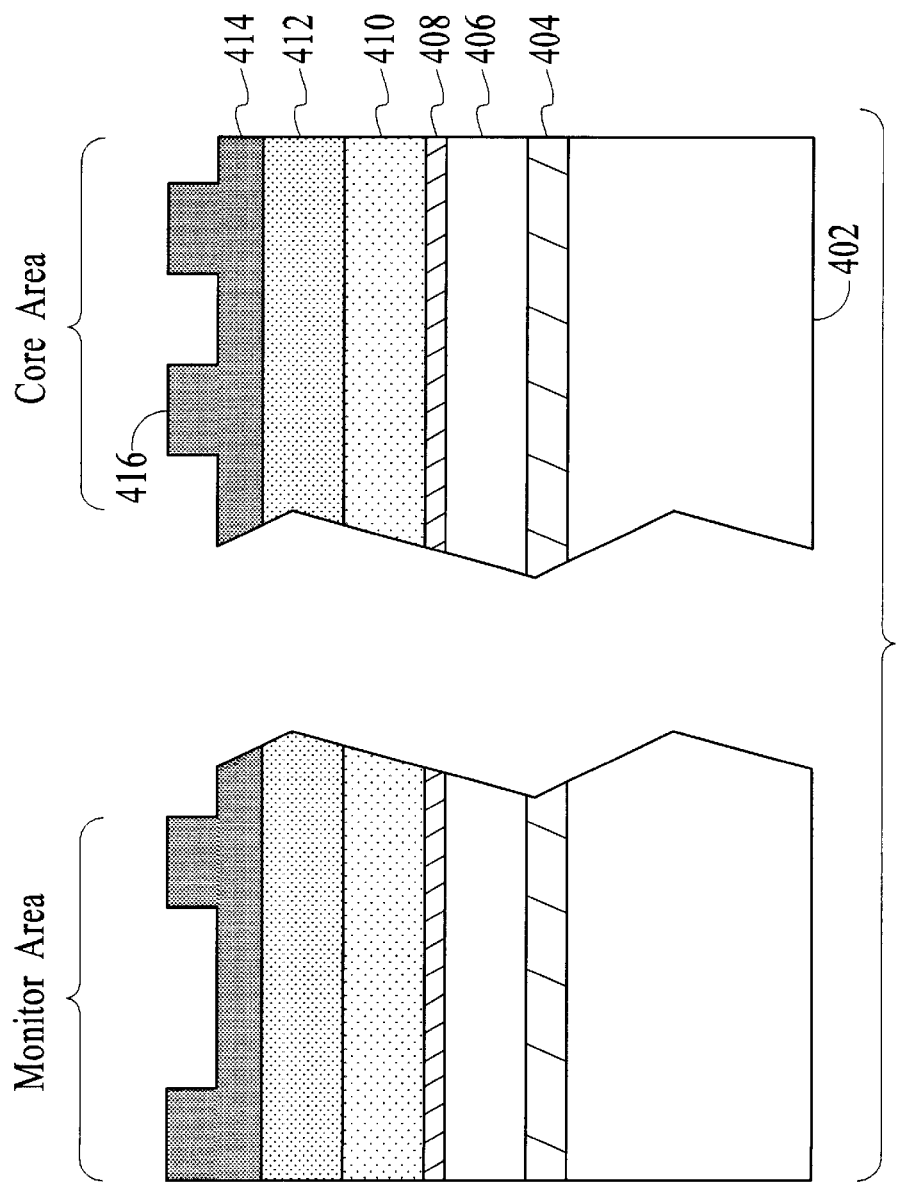
Figure 4C:
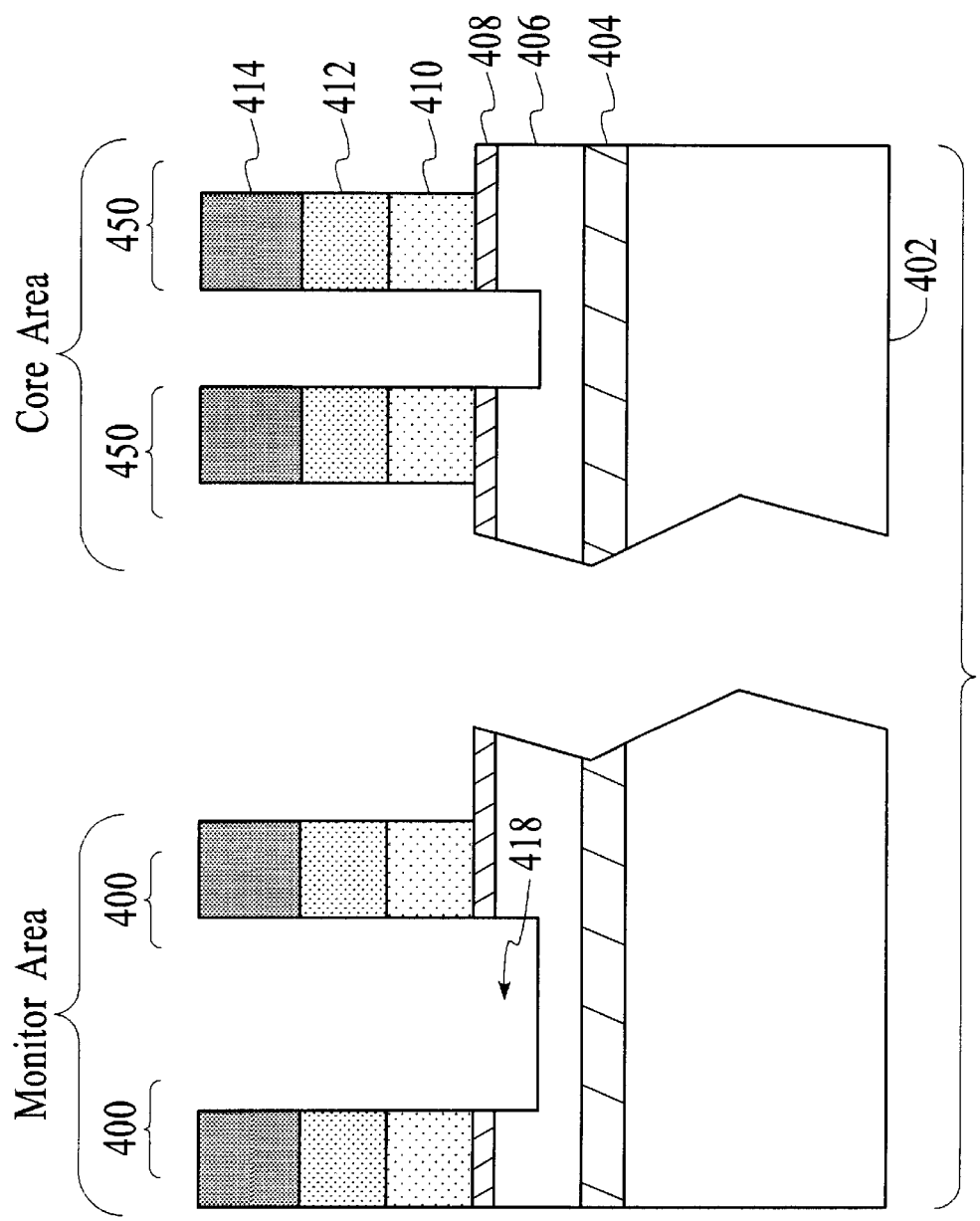

FIGS. 4A through 4C illustrate a cross-section of a portion of a flash memory device along a bit line in demonstration of the preferred embodiment of the method for providing for monitoring of a second gate over etch in accordance with the present invention. Although only a cross-section of the flash memory device is illustrated, one of ordinary skill in the art will understand that a plurality of cells may be fabricated in the flash memory device in a similar manner.

As illustrated in FIG. 4A, the flash memory device has a monitor area and a core area. In both the monitor and the core areas, a select oxide layer 404, a select gate layer 406, an insulating layer 408, a polysilicon layer 410, a tungsten silicide layer 412, and a silicon oxynitride cap layer 414 are formed on the substrate 402, via step 302. The polysilicon layer 410 and the tungsten silicide layer 412 form the control gate.

In the preferred embodiment, to form the select oxide layer 404, approximately 148 Å of a first oxide layer is grown on the substrate 402 using dry oxidation at about 900° C. with an atmosphere of about 1.33 liters of $O_2$, 70 cc of HCl, and 12.6 liters of Ar. Then a second oxide layer is grown on the first oxide layer using dry oxidation techniques at about 1050° C. with an atmosphere of about 1.33 liters of $O_2$, 70 cc of HCl, and 12.6 liters of Ar. The result is approximately 168 Å of the select oxide layer 404.

In the preferred embodiment, approximately 700 Å of in-situ doped amorphous silicon is used to form the select gate layer 406. The in-situ doped amorphous silicon is deposited using low pressure chemical vapor deposition (LPCVD) techniques at about 450–580° C., preferably 530° C., and 300–550 mT, preferably 400 mT, with about 1200–3000 sccm of $SiH_4$, preferably 2000 sccm, and 15–30 sccm of a mixture of 1% by weight of $PH_3$ in He, preferably 22 sccm.

In the preferred embodiment, the insulating layer 408 is a dielectric layer comprised of two oxide layers with a layer of nitride sandwiched in-between, called an ONO layer. Approximately 50 Å of the first of the two oxide layers is first deposited on the doped amorphous silicon layer 312 at about 750° C. and 600 mT with about 20 cc of $SiH_4$, and 1.2 liters of $N_2O$. Then approximately 80 Å of the nitride layer is deposited at about 760° C. and 330 mT with about 600 cc of $NH_3$, and 100 cc of $SiH_2Cl_2$. The second of the two oxide layers of the dielectric layer 314 is formed using a nitride oxidation technique at about 950° C. with about 5 liters of $O_2$, and 9 liters of $H_2$ for about 40 minutes, which grows approximately 50 Å of oxide. The result is approximately 135 Å of dielectric layer 314.

To form the control gate layer, first the polysilicon layer 410 is deposited on the dielectric layer 408. The polysilicon layer 410 may be comprised of doped amorphous silicon. Then, the tungsten silicide layer 412 is deposited on the polysilicon layer 410, and the silicon oxynitride layer 414 is deposited on the tungsten silicide layer 412. In the preferred embodiment, approximately 1200 Å of the polysilicon layer 410 is deposited. With a polysilicon layer comprised of doped amorphous silicon, the layer 410 is deposited using LPCVD techniques at about 530° C. and 400 mT with about 2000 sccm of $SiH_4$, and 75 sccm of a mixture of 1% by weight of $PH_3$ in He. Approximately 1500 Å of the tungsten silicide layer 412 is deposited at about 360° C. and 200 mT with about 500 sccm of $SiH_4$, and 50 sccm of Ar. Approximately 1000 Å of the silicon oxynitride layer 414 is deposited at about 400° C., 300–340 W, and 3.5 mT with about 90–110 sccm of $SiH_4$, 450–550 sccm of $N_2$, and 35–45 sccm of $N_2O$.

Next, as illustrated in FIG. 4B, a mask 416 is placed over the monitor and core areas, via step 304. The mask 416 contains the pattern for the select transistors in the core area and the pattern for the monitor structures in the monitor area.

Next, as illustrated in FIG. 4C, the second gate etch is performed to form the select transistor stack structures 450 and the monitor structures 400, via step 306. The silicon oxynitride layer 414, the tungsten silicide layer 412, and the polysilicon layer 410 are etched in the second gate etch. In the preferred embodiment, the etch of the silicon oxynitride layer 414 is performed at about 50 mT and 500 W of radio frequency (RF) power with about 15 sccm of $CHF_3$, 5 sccm of $O_2$, 30 sccm of $CF_4$, and 100 sccm of Ar. The etch of the tungsten silicide layer 412 is performed at about 3 mT and 1600 W of RF power with about 175 sccm of $Cl_2$, 12 sccm of $N_2$, and 8 sccm of a mixture of He and $O_2$. The etch of the polysilicon layer 410 is performed at about 4 mT, 225 W of RF power, and 65° C. at about 45 sccm of $O_2$, 135 sccm of HBr, 12 sccm of a mixture of He and $O_2$.

If a second gate over etch occurs, then the insulating layer 408 and/or at least a portion of the select gate layer 406 are etched as well. In the preferred embodiment, the monitor structures 400 are placed far enough apart so that the thickness of the select gate layer 406 of the monitor structures may be measured using the area 418 between them. The thickness of the select gate layer 406 of the monitor structures 400 may then be determined, via step 204. The thickness is measured at the area 418 using the above described ways. Since the select gate layer 406 of the monitor structures 400 is the same select gate layer 406 of the select transistor stack structures 450, the thickness of the select gate layer 406 of the select transistor stack structures 450 is the same as the thickness determined at the monitor structures 400. Based on this measurement, a determination of whether or not a second gate over etch occurred at the select transistor stack structures 450 may be made, via step 206.

A method for monitoring for a second gate over etch in a flash memory device has been disclosed. The select gate layer of the monitor structure is the same select gate layer of the select transistor stack structure. The select gate thickness of the select transistor stack structure may be determined by measuring the thickness at the monitor structure. This measurement is possible at the monitor area because the monitor structures are placed far enough apart to support measuring instruments. With the method in accordance with the present invention, a second gate over etch and its extent can be monitored without destroying the device. The method requires less time than conventional monitoring methods and is also less costly.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A flash memory device, comprising:

a substrate, comprising a core area and a monitor area;

at least one select transistor stack structure in the core area, comprising a first select gate layer with a first thickness; and at least one monitor structure in the monitor area, comprising a second select gate layer with a second thickness, wherein the first thickness is determined based upon the second thickness, wherein the first thickness is compared with an intended thickness for the first select gate layer to determine if the second gate over etch occurred at the at least one select transistor stack structure.

* * * * *